(12) United States Patent
Zhu (10) Patent No.: US 7,501,643 B2
(45) Date of Patent: Mar. 10, 2009

(54) METHOD FOR CONTROLLING CHARGE AMOUNT OF ION BEAM AND A WAFER APPLIED IN THE METHOD

(75) Inventor: Jinquan Zhu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 262 days.

(21) Appl. No.: 11/618,236

(22) Filed: Dec. 29, 2006

(65) Prior Publication Data

US 2008/0078958 A1   Apr. 3, 2008

(30) Foreign Application Priority Data

Sep. 30, 2006   (CN)   ................. 2006 1 0116903

(51) Int. Cl.
*H01J 37/317*   (2006.01)
*H01J 37/04*    (2006.01)
*H01J 37/08*    (2006.01)

(52) U.S. Cl. .............. 250/492.21; 250/492.2; 250/492.3; 250/423 R; 250/424

(58) Field of Classification Search .......... 250/492.21, 250/492.2, 492.3, 423 R, 424
See application file for complete search history.

(56) References Cited

U.S. PATENT DOCUMENTS

| 2006/0113640 | A1* | 6/2006 | Yu et al. ............... 257/635 |
| 2008/0078959 | A1* | 4/2008 | Zhu .................. 250/492.21 |

\* cited by examiner

*Primary Examiner*—Nikita Wells
(74) *Attorney, Agent, or Firm*—Squire, Sanders & Dempsey, L.L.P.

(57) ABSTRACT

A method of controlling charge amount of an ion beam, includes providing a semiconductor wafer; forming an insulation layer on the surface of the wafer, with gaps between parts of the insulation layer dividing the surface of the wafer into an open region and a narrow and long region; implanting an ion beam into the wafer, in which a specific amount of electrons is added into the ion beam; measuring a plurality of sheet resistance values along the open region and the narrow and long region; adjusting the amount of the added electrons according to the variation of the plurality of sheet resistance values. The method of the present invention can be used to determine whether the amount of added electrons is optimal by monitoring the uniformity of ion implantation, and make adjustment accordingly.

10 Claims, 7 Drawing Sheets

METHOD FOR CONTROLLING CHARGE AMOUNT OF ION BEAM AND A WAFER APPLIED IN THE METHOD

This application claims the priority of Chinese Patent Application 200610116903.1, filed Sep. 30, 2006, the entire disclosure of which is incorporated herein by reference.

FIELD OF THE INVENTION

The present invention relates to the field of semiconductor manufacture technology, particularly to a method for detecting the charge characteristic of an ion beam and a wafer applied in the method.

DESCRIPTION OF RELATED ARTS

Figure 1:
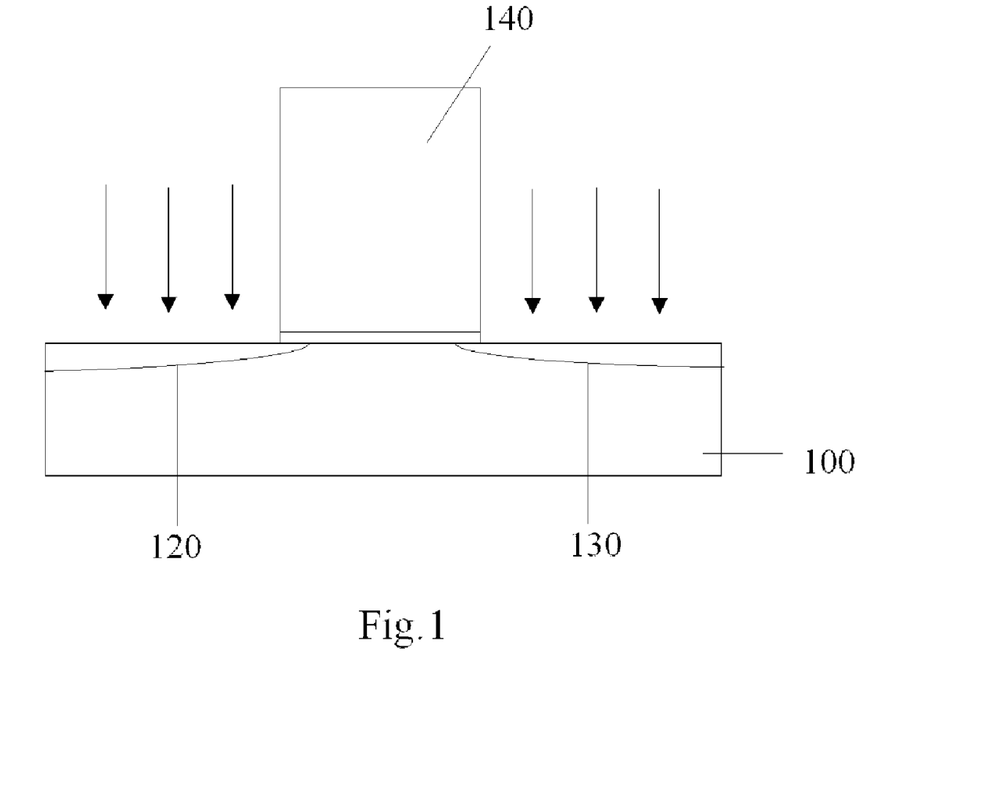
FIG. 1 is a cross-sectional diagram illustrating the extension doping into the source/drain region in an MOS device.
Figure 2:
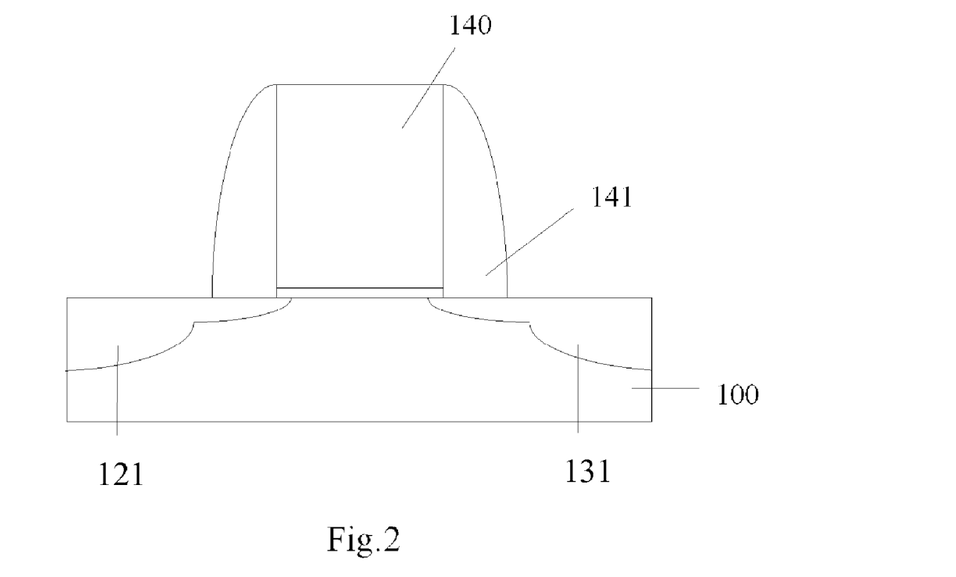
FIG. 2 is a cross-sectional diagram illustrating the heavy doping into the source/drain region in an MOS device.

With the rapid development of semiconductor manufacture technology, semiconductor wafers are advancing to have higher component density and higher integration scale, in order to achieve a higher speed of calculation, a larger data storage and more functions. The feature size of a gate in a CMOS (complementary metal-oxide semiconductor) device has been down to deep sub-micrometer, and the gate has become increasingly narrower but shorter in length than usual. For better electrical characteristics, such as the transition rate of carriers, threshold voltage and drive current, it is generally necessary to implant impurity ions into specific region(s) in the device, for example, to implant an N type or P type impurity into the source region and the gate region in an MOS transistor. Light doping, generally referred to as extension doping, is also performed on the extension region of the source region and the drain region to make the source/drain junction region shallow so as to avoid the shallow trench effect. FIG. 1 is a cross-sectional diagram illustrating extension doping into the source/drain region in an MOS device. FIG. 2 is a cross-sectional diagram illustrating heavy doping into the source/drain region in an MOS device. As shown in FIG. 1, impurity ions are implanted to form extension doping regions 120 and 130 after a gate 140 is formed on a semiconductor substrate 100. As shown in FIG. 2, offset spacers 141 are then formed in both sides of the gate 140, and heavy doping is performed on the source region and the drain region by means of a self-alignment process to form a source 121 and a drain 131. For NMOS devices, the N type impurity ions are phosphor ($P^+$) or arsenic ($As^+$); while for PMOS devices, the P type impurity ions are mainly boron ($B^+$).

For a process node below 65 nm, the amount and uniformity for implanting ions should be controlled well. During ion implantation, ionized impurity atoms are injected into the surface of the wafer after being accelerated by an electrostatic field. The amount of implantation can be controlled strictly by measuring the ion current, the penetrating depth of impurity ions can be controlled by controlling the electrostatic field. The amount for the implantation process ranges from a very light doping $10^{11}$ $cm^{-2}$ to $10^{16}$ $cm^{-2}$, such as used in the low resistance region of source/drain. The amount of implantation should be higher than $10^{18}$ $cm^{-2}$ for certain applications.

Figure 3:
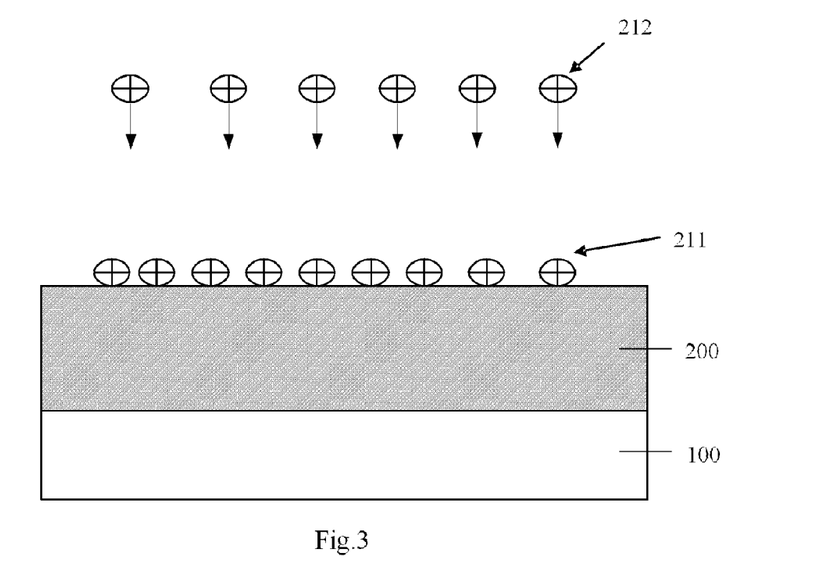
FIG. 3 is a cross-sectional diagram illustrating charges accumulating on the surface of a wafer during ion implantation.

During the implantation into the whole wafer, an ion implantation system first sends into a reactor chamber a gas which contains substance to be implanted. Generally the gas to be used in the silicon process is $BF_3$, $AsH_3$ and $PH_3$; and the gas commonly used in GaAs process is $SiH_4$ and $H_2$. FIG. 3 is a cross-sectional diagram illustrating charges being accumulated on the surface of a wafer during the ion implantation. As shown in FIG. 3, the gas is excited into charged ions 212 in the discharging chamber, which are usually positively charged ions. The charged ions 212 form an ion beam under the function of the electrodes. In many cases, there are one or more material layers, such as silicon oxide or photoresist layers, etc., on the surface of a silicon substrate. When ions are implanted, a blanket implantation with a uniform amount is used. The materials exposed on the surface of the silicon wafer, such as a photoresist or oxide layer 200, are all insulators. The secondary electrons will be emitted out when the ions strike the surface of the silicon wafer. As a result, these layers may be filled with charges 211 and the surface of wafer is partially charged.

During the manufacture of semiconductor devices, since many processes, such as ion implantation, plasma etching or chemical vapor deposition (CVD), are performed by use of charged particles, the wafer is often charged. The accumulated charges on the insulation layer on the surface of the wafer will establish a space electric field. The insulation layer, on which charges are accumulated, will produce an increasingly stronger repulsion to the ion beam when the amount of accumulated charges increases. In this way, the amount of ions implanted into a region of the substrate adjacent to an insulating layer will decrease, thus reducing the uniformity of ion implantation into the surface of the wafer. Furthermore, the thin gate oxide layer in an MOS transistor is easily damaged due to the tunnel current resulting from the charges conducted on the surface of the polysilicon or metal layer, thereby decreasing the yield of devices.

Chinese Patent application No. 02156342.X discloses a method for detecting charges on the surface of a wafer during the processing of the wafer and the manufacture of devices, particularly during the implantation of plasma and ions. In this method, a detecting circuit consisting of MOS transistors and MOS capacitors is formed in a substrate. The detecting circuit sends the charges accumulated on the wafer to a charge collecting electrode, and the amount of charges is acquired by reading the charges on the electrode board. Although the charges on the surface of the wafer can be detected by this method, how to eliminate the charging phenomenon of the positive charges of an ion beam to a wafer is not provided. Furthermore, a separate device structure to be used as a charge detecting circuit needs to be formed on the substrate, which occupies the wafer area, thus increasing the complexity of processes and the manufacture cost.

In another Chinese Patent application No. 02154880.3, a device and method of ion beam radiation for limiting charge accumulation on the substrate is introduced, in which ECR (Electron Cyclotron Resonance) discharge is established by the way of adjusting radio frequency power output in an ECR ion producing equipment, so as to obtain energy-adjustable electrons. The amount of the added electrons can be controlled by changing the modulation frequency. Consequently, the energy of the electrons in the ion beam is controlled, thereby decreasing or adjusting the charge potential accumulation of the ion beam on the surface of the substrate. Although in this method an ion beam with appropriate charge potential can be obtained by adjusting the modulation frequency to decrease the charge potential of the ion beam and maintain a suitable ion state, the problems, such as how to determine the relationship between the amount of added electrons and uniformity of ion implantation on the surface of substrate, and how to control the amount of added electrons to attain the best uniformity of ion implantation, are still remain unsolved.

SUMMARY OF THE INVENTION

The embodiments of the present invention include a method for controlling the charge amount of an ion beam, which could improve the uniformity of ion implanting energy by adjusting the amount of electrons added into the ion beam.

The method for controlling the charge amount of an ion beam includes:

providing a semiconductor wafer;

forming an insulation layer on the surface of the wafer, with a gap between the parts of the insulation layer dividing the surface of the wafer into an open region and a narrow and long region;

implanting an ion beam into the wafer, in which a specific amount of electrons is added into the ion beam;

measuring a plurality of sheet resistance values along the open region and the narrow and long region;

adjusting the amount of the added electrons according to the variation of the plurality of sheet resistance values.

According to an embodiment of the present invention, the step of forming an insulation layer includes:

depositing an insulation material on the surface of the wafer;

coating photoresist and patterning the photoresist to form an insulation layer mask pattern;

etching the insulation layer uncovered by the mask pattern and removing the photoresist.

According to an embodiment of the present invention, the insulation material is silicon oxide or silicon nitride.

According to an embodiment of the present invention, the insulation layer has a thickness of 20 Å to 30000 Å.

According to an embodiment of the present invention, the narrow and long region has a width of 1 mm to 200 mm.

According to an embodiment of the present invention, the open region and the narrow and long region are connected.

According to an embodiment of the present invention, the open region and the narrow and long region are symmetrically distributed along a diameter direction of the wafer.

According to an embodiment of the present invention, if the sheet resistance value in the open region is smaller than that in the narrow and long region, the amount of the added electrons is increased; and if the sheet resistance value in the open region is greater than that in the narrow and long region, the amount of the added electrons is decreased.

According to an embodiment of the present invention, the number of sheet resistance values is 15 to 500.

According to an embodiment of the present invention, the method also includes the step of annealing the wafer.

Accordingly, the embodiments of the present invention also include a semiconductor wafer. The wafer has at least two parts of an insulation layer, wherein there is a gap between the at least two parts of the insulation layer, and wherein the surface of the wafer uncovered by the insulation layer contains an open region connected with the insulation layer and at least one narrow and long region between the parts of the insulation layer and connected with the open region.

The open region and the narrow and long region are symmetrically distributed along the direction of a wafer diameter. The width of the narrow and long region is 1 mm to 200 mm. The insulation layer has a thickness of 20 Å to 30000 Å. The number of the narrow and long regions is 1 to 5.

The present invention provides the following benefits over the prior art:

With the method of the present invention for controlling the charge amount of an ion beam charge, a wafer is first provided as the test wafer before the actual production, and then an insulation layer pattern with a specific layout is formed on the wafer, which divides the surface of the wafer into a "plateau region", i.e. a larger area region; and a "gorge region", i.e. a narrow and long region. Then, ion implantation is performed on the test wafer under the ion implanting condition in an actual process, and a suitable amount of electrons is added into the reactive chamber. During the ion implantation, the ion beam is blanketly implanted on the whole wafer. The positive charged ions therein strike consecutively on the surface of the insulation layer and silicon substrates. The ions strike on the surface of the silicon substrate enter into the inner side of substrate, while the ions strike on the surface of insulation layer release the secondary electrons which accumulate on the surface of the insulation layer. Thus the insulation layer is positively charged. As the ion implantation proceeds, the positively charged insulation layer has an increasingly strong repulsion to the ion beam, thus reducing the ion implanting energy in the narrow and long region on the surface of wafer, and reducing the amount of ions implanted into the narrow and long region. This results in a non-uniformity of ion implantation between the plateau region and the gorge region, and thus the difference in sheet resistances of the substrate in the plateau region and the gorge region. By adding a suitable amount of electrons into the reactive chamber, the positive charges in the ion beam and the positive charges accumulated on the surface of insulation layer may be neutralized. As a result, the charge potential in the ion beam will decrease, the accumulated charges in the insulation layer will be reduced, which reduces the repulsion to the ion beam, so that the strength of ion implanting in the gorge region may be increased, and the difference in uniformity of ion implanting between the plateau region and the gorge region may be reduced. The amount of added electrons determines the difference in uniformity of ion implanting between the plateau region and the gorge region, while such a difference can be characterized by the sheet resistance variation of the substrate along the plateau region to the gorge region. In the method of the present invention, after the ion implantation into the test wafer is completed, the amount of electrons to be added in the ion beam is determined by measuring the sheet resistance variation from the plateau region to the gorge region. Then the amount of the added electrons is adjusted so as to achieve a suitable charge potential in the ion beam and the surface of insulation layer, thus improving the uniformity of ion implanting energy. This method provides accurate and valuable process parameters for the following regular wafer production in order to ensure a good effect of ion implanting.

BRIEF DESCRIPTION OF THE DRAWINGS

Various additional objects, features and advantages of the present invention can be more fully appreciated with reference to the detailed description of preferable embodiments of the present invention as shown in accompanying drawings. Throughout the drawings, same symbols denote the same parts. The drawings are not proportionally depicted intentionally, but are illustrated to emphasize the essence of the present invention. The thickness of layers and regions is enlarged in the accompanying drawing for clarity.

DETAILED DESCRIPTION OF THE INVENTION

The above and other objects and features of the present invention will become better understood referring to the following description of the preferred embodiments in conjunction with the accompanying drawings.

While many specific details are described below to allow a better understanding of the present invention, the present invention may be practiced in many different ways. Those skilled in the art shall recognize similar extension and generalization without go beyond the scope of the present invention. Thus, the present invention shall not be limited to the particular implementations described below.

The ion implantation process is an important process in semiconductor manufacture technology. To facilitate the use and control, a gas source is generally utilized, in which the atoms of the gas dopant are ionized into ions. Ion implantation is a physical process, that is, the implantation is not dependent on the reaction between the impurity and the wafer material. The dopant atoms are ionized, separated, and accelerated to form an ion beam flowing across the wafer. The impurity ions strike the wafer physically, enter into the surface and stop under the surface. The implanted impurity ions result in a variation in the sheet resistance of the substrate.

The ionization process occurs in an ionizing reactive cavity with active vapor, in which a low pressure of approximate $10^{-5}$ torr is maintained. The gas within the reactive cavity flows between a hot filament (cathode) and a metal electrode (anode). Compared with the metal electrode, the filament sustains a relatively large negative potential, and its surface is heated to the electron emitting temperature so as to produce electrons. The negatively charged electrons are attracted by the anode in the reactive cavity, and are accelerated towards the anode. The electrons collide with the molecular of the impurity source during the movement from the filament to the anode, and produce a positive ion beam formed by the elements contained in a large number of impurity molecules.

In many cases, there are one or more insulation layers, such as a silicon oxide layer, silicon nitride layer or photoresist layer, on the surface of the wafer. The insulation layer pattern is formed on the surface of the silicon wafer by a photolithographic process. Then the silicon wafer is placed within a reactive cavity for ion implantation. When the ions strike the surface of the wafer, a high strength beam with a large number of positive charges electrifies the insulation layer on the surface of the wafer.

During the ion implantation, the ion beam is blanketly implanted over the whole wafer, in which positively charged ions strike the surface of the insulation layer and the substrate consecutively. The implanted ions accumulate positive charges to positively electrify the insulation layer. With the proceeding of ion implantation, the positively charged insulation layer produces a stronger repulsion to the ion beam, which results in the non-uniformity of ion implantation on the surface of the insulation layer and the substrate.

In the method of the present invention for controlling the charge amount of an ion beam charge, a wafer is first provided as the test wafer, and then an insulation layer is formed on the wafer, which divides the surface of the wafer into a "plateau region", i.e. a region with larger area; and a "gorge region", i.e. a narrow and long region. Then, ion implantation is performed on the test wafer under the ion implanting condition in an actual process, and a suitable amount of electrons is added into the ion beam. The amount of the added electrons determines the difference in uniformity of ion implanting energy between the plateau region and the gorge region, which can be characterized by the sheet resistance variation of the substrate. After ion implantation into the test wafer, the relationship between the amount of electrons added into the ion beam and the sheet resistance of the substrate surface is determined by measuring the sheet resistance variation in the plateau region and the gorge region. Further, the amount of the added electrons is adjusted so that a suitable level of charge potential may be achieved on the ion beam and the surface of insulation layer, thereby enabling an optimal uniformity of ion implanting energy. Thus, accurate and valuable parameters on the amount of electrons to be added are provided for the following regular wafer production so as to ensure a good effect of ion implantation. The present invention will be described in more details below with reference to FIGS. 4 to 8.

Figure 4A:
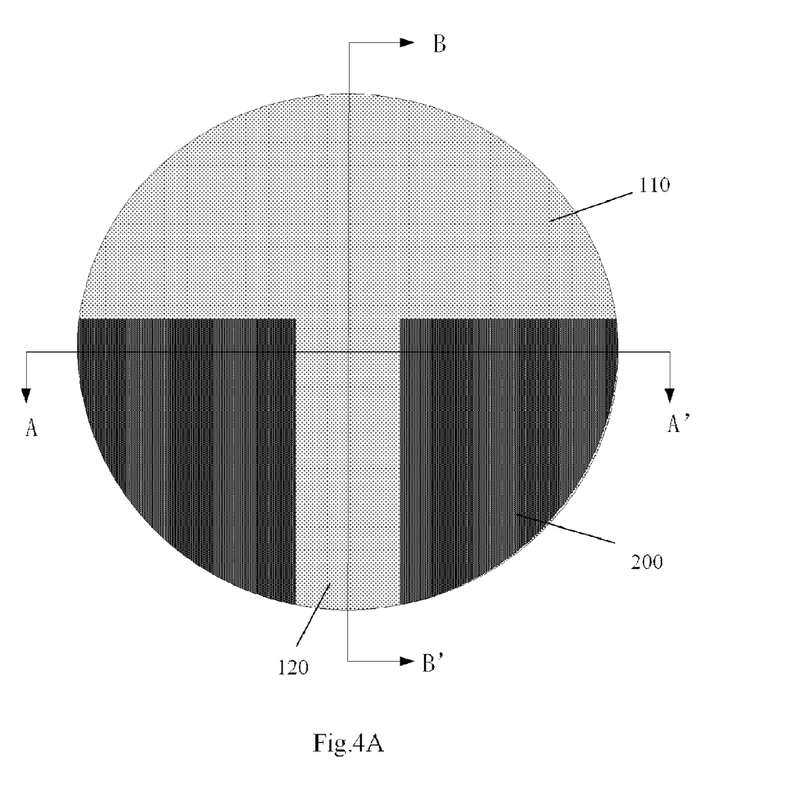
FIG. 4A is a diagram of an insulation layer pattern formed on a test wafer according to an embodiment of the present invention.

FIG. 4A is a diagram illustrating an insulation layer pattern formed on a test wafer according to an embodiment of the present invention. This diagram is merely an example, which should not unduly limit the scope of the present invention. As shown in FIG. 4, in order to obtain the relationship between the amount of added electrons and the uniformity of ion implantation, a test wafer is first provided, and a test pattern is formed on the surface of the test wafer. The test pattern is the layout of an insulation layer with a specific shape, which divides the wafer surface into a region with a larger area which is referred to as a plateau region, and a narrow and long region which is referred to as a gorge region. For example, the insulation layer 200 covering the surface of the wafer divides the surface of the wafer into a plateau region 110 and a gorge region 120. The method for forming the insulation layer 200 usually employs the conventional photolithographic and etching process. An insulation layer is first deposited on the surface of wafer, wherein the material of the insulation layer is silicon oxide or silicon nitride. The chemical vapor deposition (CVD) method may be utilized, and the insulation layer may have a thickness ranging from 20 Å to 30000 Å. Then, the photoresist is coated; a desired pattern is formed by exposing and developing; and the pattern is used as a mask to etch the exposed part of the insulation layer. The insulation layer 200 are formed after the photoresist is removed. There is no strict limitation for the shape of the insulation layer 200, provided that the wafer can be divided into the regions as described above, i.e. a plateau region 110 of a large area and a narrow and long gorge region on the surface of wafer. The location of the insulation layer 200 is preferably adjacent to half of the wafer to divide the wafer surface into the plateau region 110 and the gorge region 120. The width between the gorge region 120 is preferably 1 mm to 200 mm. It should be noted that the gorge region 120 may be a plurality of regions, depending on the distribution of active areas (AA) in the wafer. In other words, the area of the insulation layer 200 should be approximately equal to that of the active areas. When the active areas are denser, 2-5 gorge regions can be set.

Figure 4B:
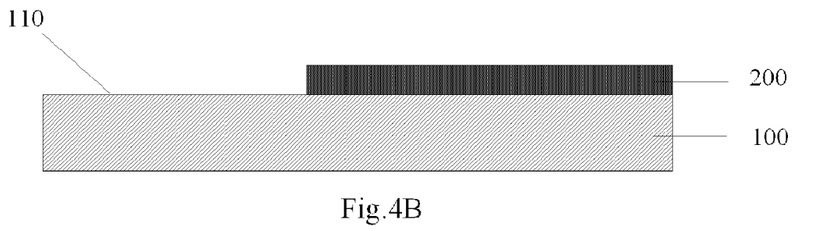
FIG. 4B is a cross-sectional diagram along the line B-B' as shown in FIG. 4A.
Figure 4C:
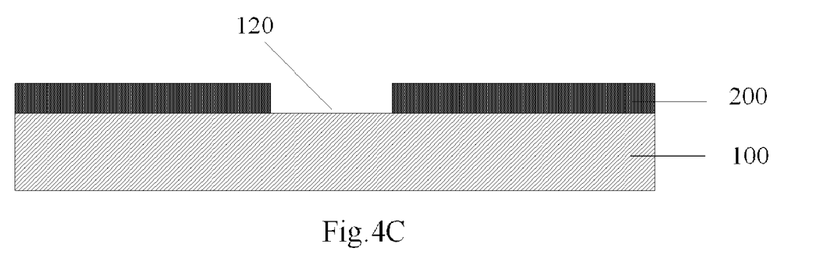
FIG. 4C is a cross-sectional diagram along the line A-A' as shown in FIG. 4A.

FIG. 4B is a cross-sectional diagram cut along line B-B' as shown in FIG. 4A. FIG. 4C is a cross-sectional diagram shown in FIG. 4A along line A-A' as shown in FIG. 4A. These diagrams are merely examples, which should not unduly limit the scope of the present invention. As shown in FIGS. 4B and 4C, the substrate 100 may be a whole semiconductor substrate, such as single-crystal, poly-crystal or amorphous silicon (Si) or silicon-germanium (SiGe), mixed semiconductor structure (such as silicon carbide, gallium arsenide, gallium phosphide, indium antimonide, indium phosphide, indium arsenide, gallium arsenide or gallium antimonide). The substrate 100 may also be a substrate having a semiconductor on an insulation layer, such as silicon-on-insulator (SOI). The embodiments of the present invention take the silicon substrate as an example. The insulation layer 200 could be a silicon oxide or silicon nitride material, or could be other insulation materials. The plateau region 110 and the gorge region 120 are determined by dividing the insulation layer 200, and both are used as a test pattern.

Figure 5:
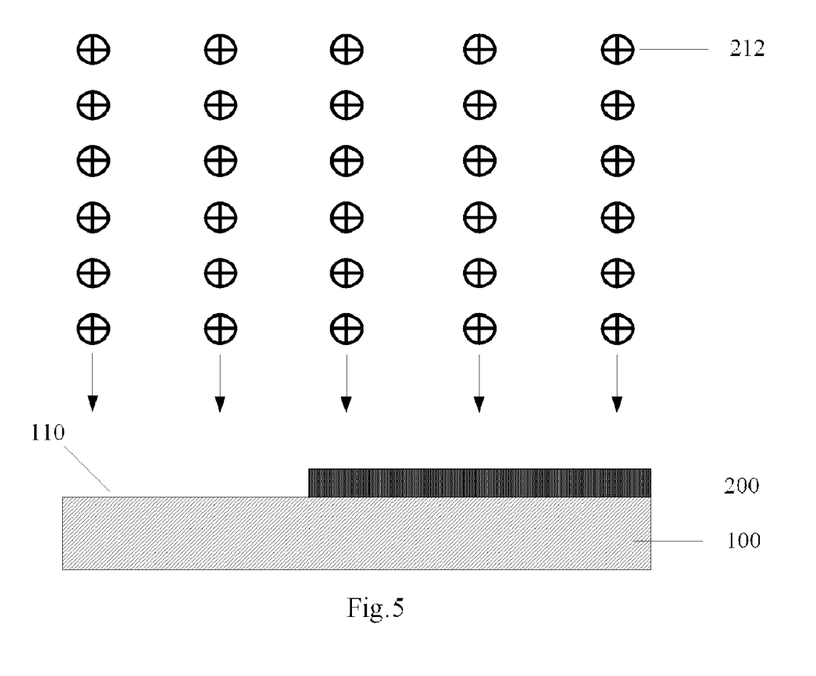
FIG. 5 is a diagram showing that the ion beam being implanted at the location as shown in FIG. 4B.

FIG. 5 is a diagram illustrating an ion beam being implanted at the location as shown in FIG. 4B. The diagram is merely an example, which should not unduly limit the scope of the present invention. The ion implantation is performed on the surface of the wafer in a reactive chamber. The surface of the wafer includes the insulation region 200, the plateau region 110 and the gorge region 120 (not shown in FIG. 5). The molecules of a gaseous source are decomposed into positively charged ions 212 after they are ionized. A plurality of ions 212 form an ion beam with uniform density and move to the surface of the wafer with high speed under the electrical field, to strike the surface of the wafer. When the ion beam strikes the plateau region 110 on the surface of the silicon substrate 100, ions enter into the inner side of the substrate below the plateau region 110. These ions and the silicon ions form covalence bond during the following annealing process, which changes the sheet resistance RS of the substrate below the plateau region 110, so that the substrate below the plateau region 110 may have a sheet resistance RS of a specific resistance value. When the ion beam strikes the insulation layer 200, the insulation material can not conduct the charges. As a result, charges will be accumulated on the surface of the insulation layer over time.

Figure 6A:
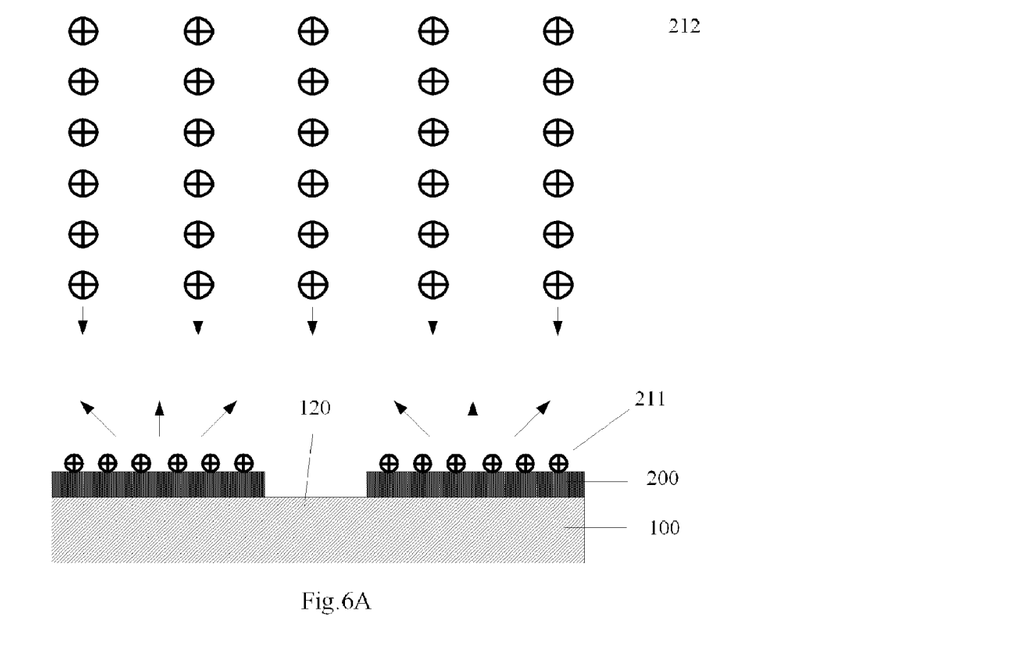
FIG. 6A is a diagram showing that the ion beam being implanted at the location as shown in FIG. 4C.

FIG. 6A is a diagram illustrating an ion beam being implanted at the location as shown in FIG. 4C. This diagram is merely an example, which should not unduly limit the scope of the present invention. As shown in FIG. 6A, the surface of the substrate 100 includes the insulation layer 200, and the gorge region 120 between the parts of the insulation layer 200, and the plateau region (not shown in FIG. 6). As ion implantation proceeds, the ion beam continually accumulates positive charges 211 on the surface of the insulation layer, so that the surface of the insulation layer 200 has an increasingly stronger positive charge potential. This potential will have an increasingly stronger repulsion to the ion beam containing a plurality of positive charges 212, so that the movement of the ion beam to the gorge region 120 between the insulation layer and the ion implantation may be impeded. This decreases the concentration of ion implantation into the gorge region 120, and results in a difference in concentration of ion implantation compared with the plateau region 110. As a result, there is also a difference in sheet resistances of the substrate between the plateau region 110 and the gorge region 120.

Figure 6B:
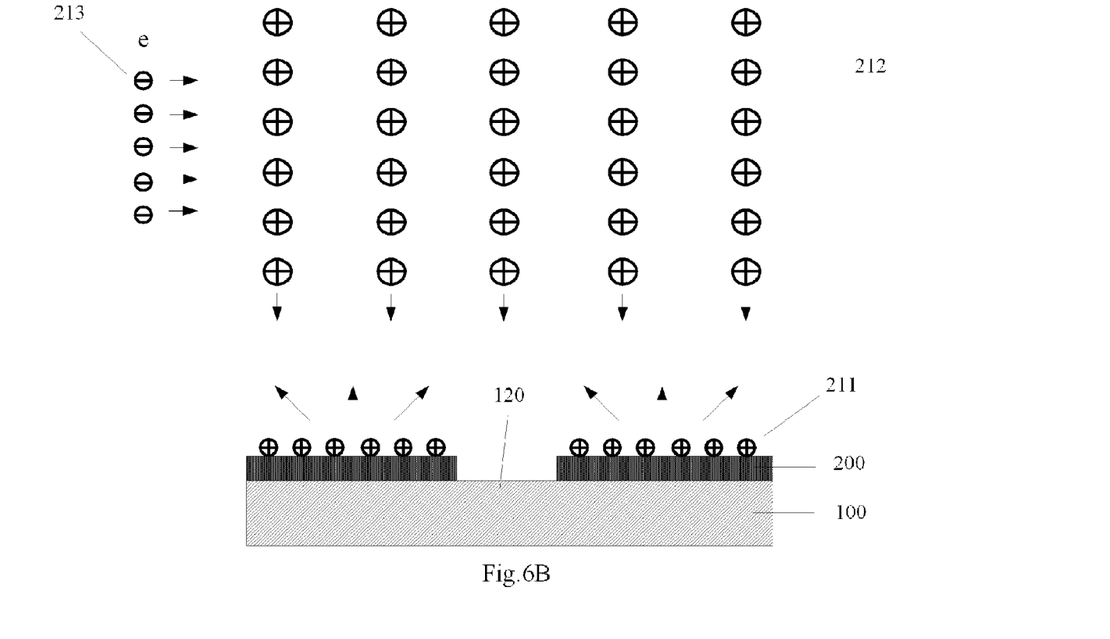
FIG. 6B is a diagram showing the case when electrons are added into the ion beam as shown in 6A.

FIG. 6B is a diagram illustrating the electrons being added into an ion beam. The diagram is merely an example, which should not unduly limit the scope of the present invention. In this embodiment of the present invention, in order to decrease the difference in concentration of ion implantation resulting from the surface electric field of the insulation layer 200, a certain amount of electrons is implanted into the reactive chamber during the ion implantation. The implanted electrons 213 will move toward the insulation layer 200 and the ion beam under the space electric field, thereby neutralizing the positive charges accumulated on the surface of the insulation layer 200, and neutralizing to some extent the positive ions in the ion beam at the same time. The resulting effect after the electrons 213 are added shows the reduction in the positive charge potential on the surface of the insulation layer 200, which decreasing the repulsion to the ion beam. The concentration of ion implantation in the gorge region 120 between parts of the insulation layer 200 is increased, thereby reducing the difference between the concentrations of ion implantation in the gorge region 120 and the plateau region 110, thus decreasing the difference between the sheet resistances.

Figure 7:
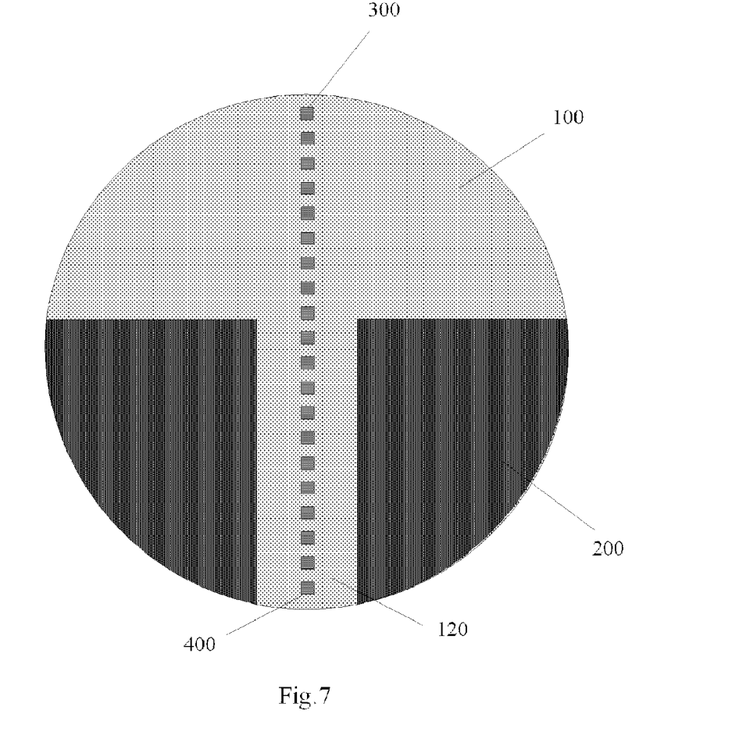
FIG. 7 is a diagram showing the method of measuring sheet resistance along the radial direction on the surface of the wafer according to an embodiment of the present invention.

In the embodiment of the present invention, the amount of the added electrons is determined by measuring the variation in sheet resistances between the plateau region 110 and the gorge region 120. A rapid annealing at above 1000° C. follows the ion implantation so as to enable the implanted ions to repair the covalence bond, and then the sheet resistance may be tested. FIG. 7 is a diagram showing a method of measuring sheet resistance along the radial direction of the wafer surface according to an embodiment of the present invention. The diagram is merely an example, which should not unduly limit the scope of the present invention. As shown in FIG. 7, the sheet resistance of the surface of the substrate is measured every a specified distance, starting from the top end 300 of the plateau region 110 of the wafer to the other end 400 of the gorge region 120 along the direction of the wafer diameter, i.e. the bottom end 400. Not less than 15 points are selected to measure the sheet resistance of the substrate surface. That is, not less than 15 square resistance values are obtained during the measurement. A curve showing the variation of the sheet resistance RS along the direction of diameter can be obtained by plotting the 15 sheet resistance values. The relationship between the sheet resistance of the substrate surface and the amount of electrons added into the ion beam can be determined from the curve described above, and the relationship between the amount of electrons added into the ion beam and the uniformity of ion implanting energy is further determined. The optimal uniformity of ion implantation energy may be achieved by adjusting the amount of added electrons to enable a suitable charge potential level for the ion beam and the surface of the insulation layer.

Figure 8A:
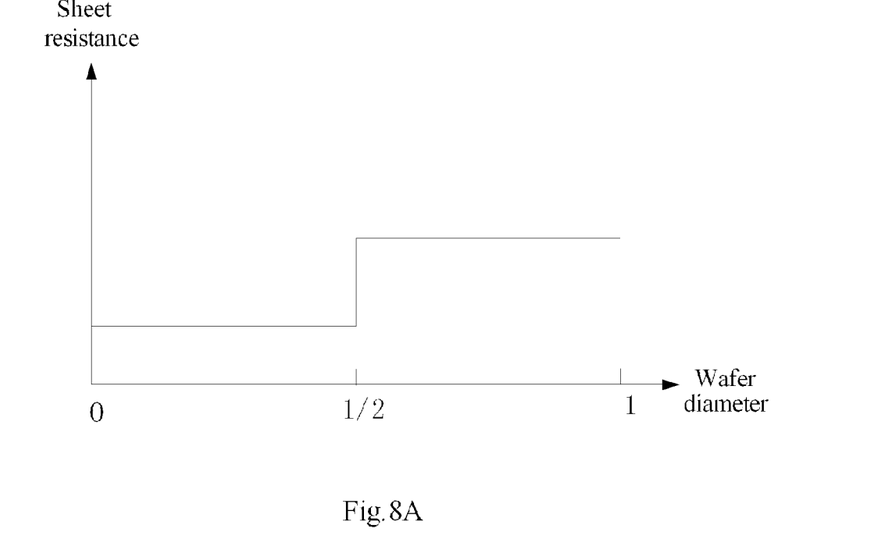
FIG. 8A is a diagram showing the variation in sheet resistance along the radial direction measured when the amount of added electrons is too small.

FIG. 8A is a diagram showing the variation in sheet resistance along the radial direction measured when the amount of added electrons is too small. The diagram is merely an example, which should not unduly limit the scope of the present invention. As shown in FIG. 8A, the abscissa represents the diameter direction of the wafer, the origin of the coordinate "0" represents the top end of the wafer, "1" represents the bottom end of the wafer, "½" represents the interface between the plateau region and the gorge region. It can be seen from this Figure, along the diameter direction from the plateau region to the gorge region, the value of the sheet resistance RS increases, that is, the sheet resistance in the gorge region is larger than that in the plateau region. This shows that the repulsion effect of the electric field to the ion beam is still large on the surface of the insulation layer if the amount of added electrons is too small, with a result that the amount of ion implantation into the gorge region can not be increased. The concentration of ion implantation into the substrate in the gorge region is smaller, resulting in a larger sheet resistance in the gorge region than that in the plateau region.

Figure 8B:
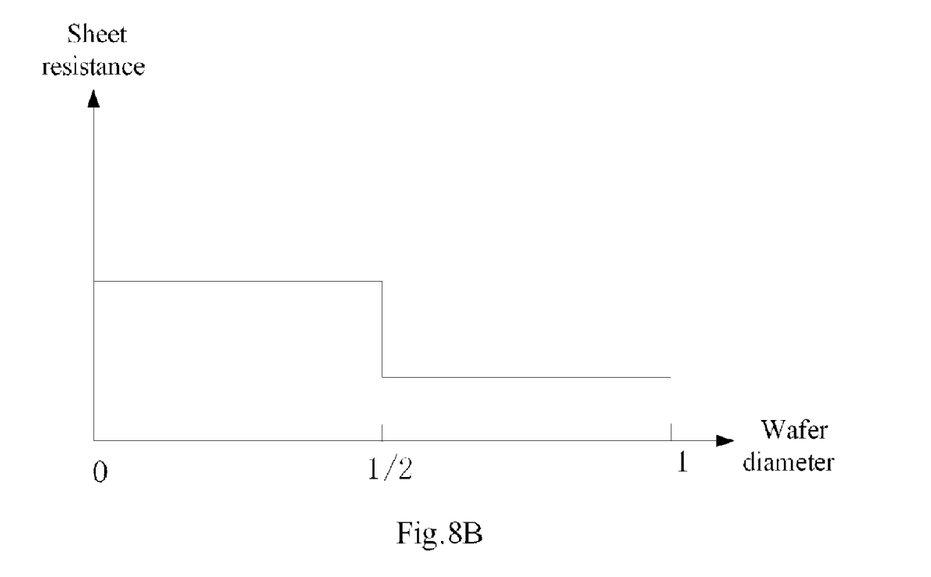
FIG. 8B is a diagram showing the variation in sheet resistance along the radial direction measured when the amount of added electrons is too large.

FIG. 8B is a diagram showing the variation in sheet resistance along the radial direction measured when the amount of added electrons is too large. The diagram is merely an example, which should not unduly limit the scope of the present invention. As shown in FIG. 8B, the abscissa represents the diameter direction of the wafer, the origin of the coordinate "0" represents the top end of the wafer, "1" represents the bottom end of the wafer, "½" represents the interface between the plateau region and the gorge region. As can be seen from this Figure, along the diameter direction from the plateau region to the gorge region, the value of the sheet resistance RS decreases, that is, the sheet resistance in the gorge region is smaller than that in the plateau region. This shows the amount of added electrons is too large, and the electrons over-neutralize the positive charges on the surface of the insulation layer. Hence the positive charge potential on the surface of the insulation layer is too low. Even a negative charge potential may occur, which greatly enhances the attraction of the electric field on the surface of insulation layer to the ion beam, so that the amount of ion implantation into the gorge region is increased, i.e., the concentration of ion implantation into the substrate in the gorge region is increased. A larger concentration of ion implantation in the gorge region results in a smaller sheet resistance in the gorge region than that in the plateau region.

Figure 8C:
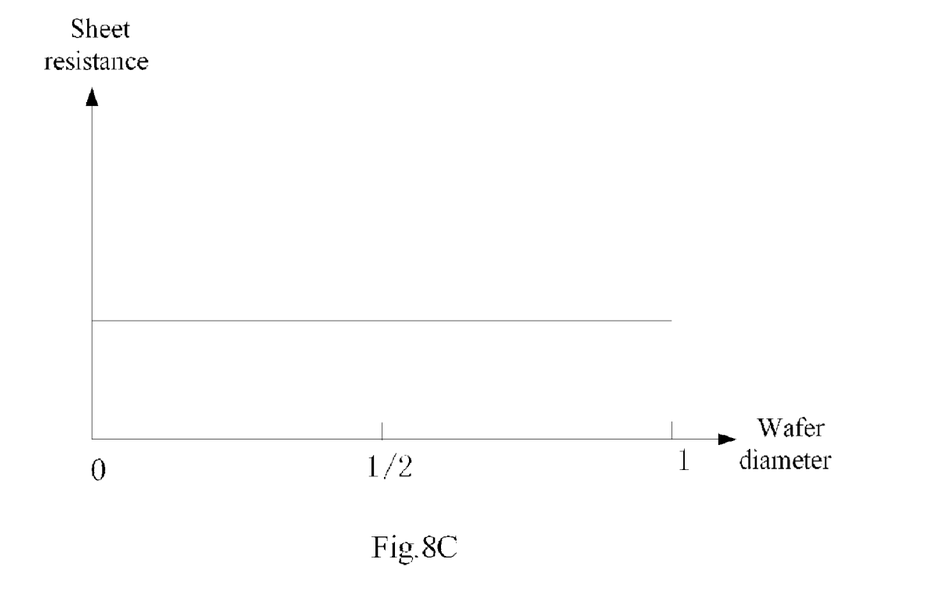
FIG. 8C is a diagram showing the variation in sheet resistance along the radial direction measured when the amount of added electrons is suitable.

FIG. 8C is a diagram showing the variation in sheet resistance along the radial direction measured when the amount of added electrons is suitable. The diagram is merely an example, which should not unduly limit the scope of the present invention. As shown in FIG. 8C, the abscissa represents the diameter direction of the wafer, the origin of coordinate "0" represents the top end of the wafer, "1" represents the bottom end of the wafer, "½" represents the interface between the plateau region to the gorge region. As can be seen from this Figure, when a suitable amount of electrons is added, the values of sheet resistance in the plateau region and the gorge region tend to be similar with no obvious difference. This shows the neutralization of electrons with the ion beam and the positive charge accumulated on the surface of the insulation layer achieves a balanced state when a suitable amount of electrons is added. This enables the ion implanting energy on the surface of the plateau region and the gorge region to be similar, with the result of an optimal uniformity of ion implantation.

During the ion implantation, a certain amount of electrons is added, and the sheet resistance is measured after the implantation is finished. A test pattern needs to be redone if the curve as shown in FIG. 8A is obtained, thus it is necessary to repeat the method according to the embodiment of the present invention described above and to increase the amount of electrons to be added. In contrast, a test pattern also needs to be redone if the curve as shown in FIG. 8B is obtained, in which case it is necessary to repeat the method according to the embodiment of the present invention described above and to decrease the amount of electrons to be added, until the curve as shown in FIG. 8C is obtained. At this time the mount of the added electrons is suitable. Applying the parameter, i.e., the amount of added electrons, in the following regular wafer production may ensure a good uniformity of ion implantation.

Figure 9A:
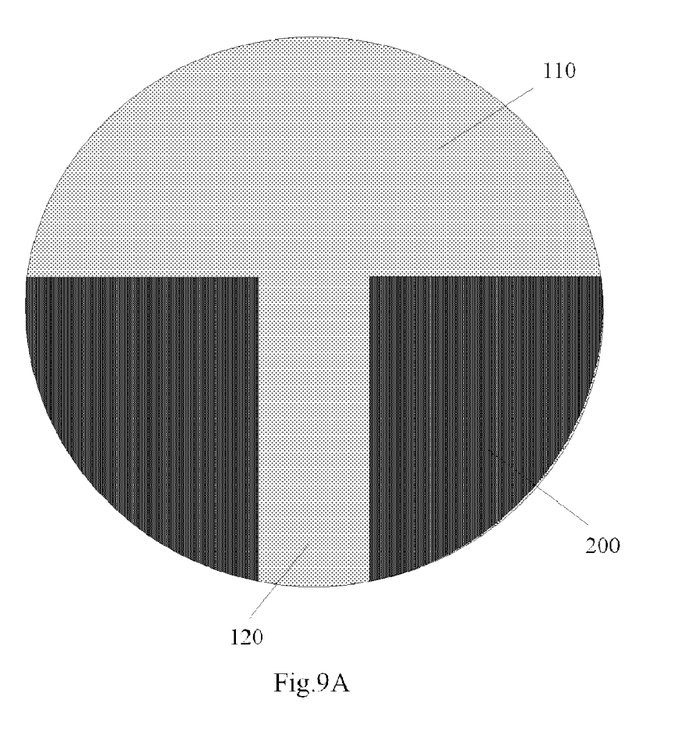
FIG. 9A and FIG. 9B are diagrams illustrating the wafer structures according to the embodiments of the present invention.
Figure 9B:
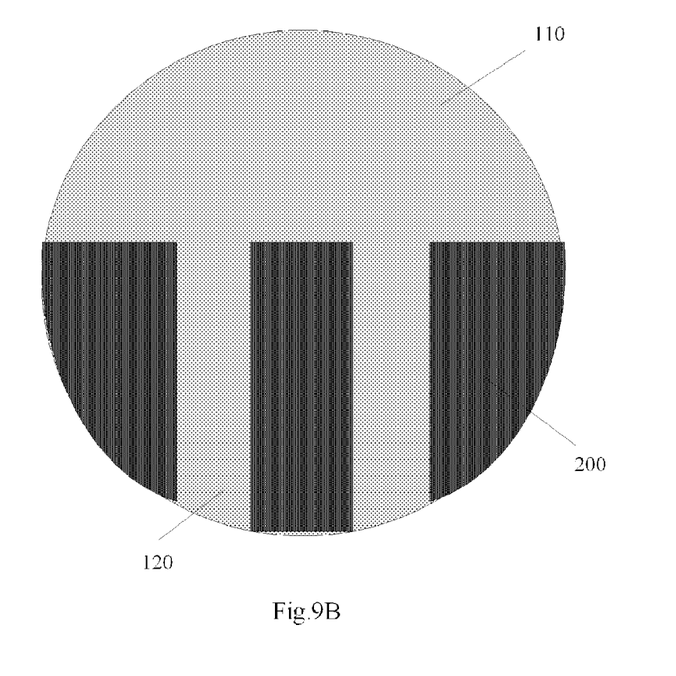

FIGS. 9A and 9B are diagrams showing the wafer structures according to an embodiment of the present invention. FIG. 9A is a diagram of a wafer structure with only one narrow and long region. FIG. 9B is a diagram of a wafer structure with two narrow and long regions. As shown in FIGS. 9A and 9B, the semiconductor wafer has at least two parts of an insulation layer 200 on the surface of the wafer, with a gap between the parts of the insulation layer 200. The surface of the wafer uncovered by the insulation layer includes an open region 110 which connects with the insulation layer 200, and at least one narrow and long region 120 which is located between the parts of the insulation layer 200 and connected with the open region 110. Preferably, the open region 110 and the narrow and long region 120 are symmetrical along the diameter of the wafer. The narrow and long region 120 has a width ranging 1 mm~200 mm. The insulation layer 200 has a thickness ranging 20 to 30000 Å, and the material of the insulation layer 200 is silicon oxide or silicon nitride. Although only examples with one or two narrow and long regions are shown here, the present invention is not limited to these examples. A plurality of narrow and long regions, for example 2~5, can be set according to the density of the active areas.

While the preferred embodiments of the present invention have been described above, the present invention should not be limited to these embodiments. Those skilled in the art would recognize many possible variations, changes and modifications or equivalent embodiments by use of the above teaching, without departing from the scope of the present invention. Therefore, those modifications or changes or equivalent variations without departing form the spirit the substantial content of the present invention are to be included within the protection scope of the present invention.

The invention claimed is:

1. A method of controlling a charge amount of an ion beam, comprising:
   providing a semiconductor wafer;
   forming an insulation layer on a surface of the wafer, wherein the insulation layer has parts and a gap between the parts of the insulation layer, wherein the insulation layer divides the surface of the wafer into an open region and a narrow and long region;
   implanting an ion beam into the wafer, wherein a specific amount of electrons is added into the ion beam;
   measuring a plurality of sheet resistance values along the open region and the narrow and long region;
   adjusting the amount of the added electrons according to the variation of sheet resistance values.

2. The method as claimed in claim 1, wherein the step of forming an insulation layer comprises:
   depositing an insulation material on the surface of the wafer;

coating photoresist and patterning the photoresist to form an insulation layer mask pattern; and etching the insulation layer uncovered by the mask pattern and removing the photoresist.

3. The method as claimed in claim 2, wherein the insulation material is silicon oxide or silicon nitride.

4. The method as claimed in claim 3, wherein the insulation layer has a thickness of 20 Å to 30000 Å.

5. The method as claimed in claim 1, wherein the narrow and long region has a width of 1 mm to 200 mm.

6. The method as claimed in claim 1, wherein the open region and the narrow and long region are connected.

7. The method as claimed in claim 6, wherein the open region and the narrow and long region are symmetrical along a diameter direction of the wafer.

8. The method as claimed in claim 1, wherein if the sheet resistance value in the open region is smaller than that in the narrow and long region, the amount of the added electrons is increased; and if the sheet resistance value in the open region is larger than that in the narrow and long region, the amount of the added electrons is decreased.

9. The method as claimed in claim 1, wherein the number of sheet resistance values is 15 to 500.

10. The method as claimed in claim 1, further comprising a step of annealing the wafer before measuring the sheet resistance values.

* * * * *